United States Patent [19]

Ouchi et al.

[11] Patent Number: 5,331,510
[45] Date of Patent: Jul. 19, 1994

[54] ELECTRONIC EQUIPMENT AND COMPUTER WITH HEAT PIPE

[75] Inventors: Katsunori Ouchi, Hitachi; Atsushi Morihara, Katsuta; Yoshio Naganuma; Koji Sato, both of Hitachi; Ryuichi Kaji, Kitaibaraki, all of Japan

[73] Assignee: Hitachi, Ltd., Tokyo, Japan

[21] Appl. No.: 936,299

[22] Filed: Aug. 28, 1992

[30] Foreign Application Priority Data

Aug. 30, 1991 [JP] Japan ................................. 3-219593

[51] Int. Cl.$^5$ ............................................... H05K 7/20
[52] U.S. Cl. ................................. 361/702; 165/104.33; 174/15.2; 361/719
[58] Field of Search ........................... 439/485; 62/64; 174/15.2, 252; 165/80.4, 104.26, 104.33; 257/706, 707, 714, 715, 723, 724; 361/382, 385, 386–388, 689, 699, 700, 701–705, 719

[56] References Cited

U.S. PATENT DOCUMENTS

| | | | |
|---|---|---|---|
| 3,788,393 | 1/1974 | Plizak | 165/109 |
| 4,120,019 | 10/1978 | Arii | 361/385 |
| 4,204,246 | 5/1980 | Arii | 361/385 |
| 4,327,399 | 4/1982 | Sasaki | 361/385 |
| 5,087,888 | 2/1992 | Mountz | 330/65 |
| 5,095,404 | 3/1992 | Chao | 361/385 |
| 5,199,165 | 4/1993 | Crawford | 29/846 |

FOREIGN PATENT DOCUMENTS 57-136354  8/1982  Japan.

OTHER PUBLICATIONS

"Heat Pipe...", Kerjilian, IBM Tech Discl Bull vol. 18 No. 12 May 1976 pp. 3982, 3983.

*Primary Examiner*—Gerald P. Tolin
*Attorney, Agent, or Firm*—Antonelli, Terry, Stout & Kraus

[57] ABSTRACT

An electronic equipment has heat pipes for radiating heat generated from heat generating electronic parts. The electronic parts are arranged such that electronic parts generating more heat are arranged nearer to a heat radiating portion of each heat pipe to prevent a phenomenon of dryout and radiate the heat efficiently, whereby heat generated from the electronic parts such as LSI chips can be effectively radiated and an excessive rise in temperature of the electronic parts can be suppressed. When the invention is applied to computers, the entire computer size can be reduced.

3 Claims, 6 Drawing Sheets

ELECTRONIC EQUIPMENT AND COMPUTER WITH HEAT PIPE

BACKGROUND OF THE INVENTION

1. Field of the Invention

The present invention relates to an electronic equipment of the structure having heat pipes capable of removing heat generated in electronic parts, and more particularly, to a computer having similar structure which is suitable for application to medium- and small-sized computers for use in work stations or the like, and a heat radiating device thereof.

2. Description of the Prior Art

In medium- and small-sized computers for use in work stations or the like, LSI chips making up a CPU have been recently changed from CMOS's into higher-speed ECL's and increased in density and integration to meet demands for high-speed data processing. With such a change in circuit system and a higher degree of integration of LSI chips, heat generated from the LSI chips is also drastically increased. Thus, how to efficiently remove the heat generated from the LSI chips and maintain the chip temperature at an appropriate level is a serious technical problem in ensuring reliability of computers.

Meanwhile, computers have a tendency to decrease in size from the desk-side type to the desk-top type and then to the lap-top type for enhancing values of commodities. Dealing successfully with those contradictory problems of radiating heat and reducing size is a key in developing in the next generation of medium- and small-sized computers.

As disclosed in Japanese Unexamined Patent Publication No. 57-136354, it is known to radiate heat generated in electronic parts such as LSI chips to the exterior through heat pipes. In the prior art referred to, electronic parts greatly generating heat are mounted via insulating sheets and insulating bushes on a flat heat transfer board having a heat pipe provided with heat radiation fins. Heat generated from those electronic parts highly generating heat is transferred successively to the insulating sheets, the insulating bushes, the heat transfer board, the heat pipe and finally to the heat radiation fins. Air is introduced to only the heat radiation fins from outside of a computer to remove the heat therefrom. Because heat exchange with the outside air is performed only in the space of the heat radiation fins, there is no need for introducing the outside air into the entire area of a computer housing, and highly efficient heat radiation can be achieved with a compact device.

Thus, the prior art is directed to reduce the size of the computer housing by transferring the heat generated by the electronic parts to the heat radiation fins through the heat pipe, and performing heat exchange collectively at the heat radiation fins to limit the heat exchange areas. Where heat is absorbed from a number of parts by the heat pipe through the heat transfer board as in the prior art, however, if too much heat is collected in the heat pipe, a working fluid sealingly enclosed in the heat pipe is completely evaporated and the heat pipe no longer fulfills its function. This phenomenon is referred to as dryout.

Further, where a heat collecting portion in which heat is absorbed into the heat pipe is relatively long in comparison with the entire length of the heat pipe, the working fluid condensed in a heat radiating portion of the heat pipe is evaporated before reaching the end of the heat collecting portion, so that the phenomenon of dryout is more likely to occur and the efficiency of heat transfer is lowered toward the outermost end of the heat collecting portion.

SUMMARY OF THE INVENTION

An object of the present invention is to provide an electronic equipment, particularly a computer, having a structure capable of radiating heat generated from a number of heat generating electronic parts to the exterior through heat pipes, in which the efficiency of heat transfer in the heat pipes is enhanced to prevent the heat pipes from drying out.

To achieve the above object, according to the present invention, there is provided an electronic equipment comprising a plurality of electronic parts and at least one heat pipe for radiating heat generated from the electronic parts, wherein electronic parts generating more heat are disposed nearer to a heat radiating portion of said heat pipe.

The electronic parts are desirably disposed along the length of the heat pipe in such a manner that electronic parts generating more heat are arranged toward the heat radiating portion of the heat pipe from the heat absorbing portion thereof.

More desirably, an electronic part generating maximum heat is disposed at a position closest to the heat radiating portion of the heat pipe, an electronic part generating minimum heat is disposed at a position farthest therefrom, and a relationship between heat generated from the electronic parts and distances from the outermost end of the heat radiating portion of the heat pipe to the electronic parts meets the following equation (1);

$$\sum_{i=1}^{n} (Q_i \cdot l_i)^2 < (Q \cdot l)^2 \qquad (1)$$

where $Q_i$ is the amount of heat generated from each of the electronic parts, $l_i$ is a distance from the outermost end of the heat radiating portion of the heat pipe to each of the electronic parts, Q is the amount of heat generated from any one of the electronic parts when a phenomenon of dryout takes place, l is a distance from the outermost end of the heat radiating portion of the heat pipe to the electronic part when the dryout takes place, and $i = 1 \ldots n$ indicates the number of the electronic parts.

According to another feature of the present invention, there is provided an electronic equipment comprising a plurality of electronic parts and at least one heat pipe for radiating heat generated from the electronic parts, wherein the electronic parts are arranged with higher density nearer to the heat radiating portion of the heat pipe.

According to a still another feature of the present invention, there is provided an electronic equipment comprising a plurality of electronic parts and at least one heat pipe for radiating heat generated from the electronic parts, wherein groups of the electronic parts are arranged such that the electronic parts which generate more heat are disposed closer to the heat radiating portion of the heat pipe.

The heat pipe is preferably provided with heat radiation fins in its heat radiating portion.

The present invention also provides a computer comprising a printed circuit board having mounted thereon a plurality of electronic parts generating different amounts of heat, a power supply circuit board, a magnetic storage system, and at least one heat pipe for radiating heat generated from the electronic parts, wherein the electronic parts are mounted on the printed circuit board such that electronic parts generating more heat are located nearer to a heat radiating portion of the heat pipe.

The present invention further provides a computer comprising a printed circuit board having mounted thereon a plurality of electronic parts, a power supply circuit board, a magnetic storage system, and at least one heat pipe for radiating-heat generated from the electronic parts, wherein the electronic parts are mounted on the printed circuit board in such a manner as to have the density thereof increased toward a heat radiating portion of the heat pipe.

In the computer as mentioned above, it is also preferable that electronic parts generating much heat are disposed at positions nearer to the heat radiating portion of the heat pipe and electronic parts generating less heat are disposed at positions farther from the heat radiating portion of the heat pipe while the foregoing equation (1) is met.

A heat radiating device of the present invention is provided with at least one heat pipe for radiating heat generated from a plurality of electronic parts and is characterized in that a heat transfer member is provided to cover a heat absorbing portion of the heat pipe, and a printed circuit board having mounted thereon the plurality of electronic parts has its side thereof adjacent the electronic parts disposed in contact with the heat transfer member.

Preferably, a flat plate-like heat absorption fin is provided in the heat absorbing portion of the heat pipe, a pair of plate-like heat transfer members are provided to sandwich the heat absorbing portion of the heat pipe and the plate-like heat absorption fin from both sides, and a printed circuit board carrying the plurality of electronic parts thereon is abutted against the heat transfer members.

The heat transfer members desirably comprise a flexible heat transfer sheet and a metallic heat transfer board, and the printed circuit board carrying the plurally of electronic parts thereon is abutted against the flexible heat transfer sheet.

It is needless to say that the heat radiating device of the present invention can be applied to a computer comprising a printed circuit board having mounted thereon a plurality of electronic parts generating different amounts of heat, a power supply circuit board, and a magnetic storage system, the computer being of the structure that heat generated from the electronic parts is radiated through a least one heat pipe.

In the computer of the present invention, it is preferred that heat radiation fins are provided in the heat radiating portion of the heat pipe, the heat pipe is so arranged as to have a length of the heat pipe extending vertically, and the heat radiation fins are positioned at levels higher than those of the electronic parts.

In the case where a plurality of heat pipes are provided, it is preferable that the heat pipes are arranged in parallel to each other, and the heat absorbing portions and the heat radiating portions of the heat pipes are located on the same side.

In addition, the present invention provides a method of manufacturing an electronic equipment wherein, when a number n of heat generating electronic parts are arranged in a heat absorbing portion of a heat pipe which has a length of l and encounters a phenomenon of dryout at an amount of heat Q under a condition that one heat generating electronic part is disposed at the outermost end of the heat absorbing portion of said heat pipe, the electronic parts are disposed such that the amount of heat $Q_i$ generated from each of said heat generating electronic parts and a distance $l_i$ from the outermost end of the heat radiating portion of said heat pipe to each of the heat generating electronic parts meet the foregoing equation (1).

With the present invention, in an electronic equipment comprising a plurality of electronic parts and at least one heat pipe for radiating heat generated from these electronic parts, electronic parts generating more heat are arranged nearer to the heat radiating portion, making it possible to prevent the heat pipe from drying out and to effectively radiate heat generated from the electronic parts such as LSI chips.

Furthermore, by applying the present invention to the structure of computers, the entire computer size can be reduced because heat can be radiated from a limited space to the outside of computer housings.

DESCRIPTION OF PREFERRED EMBODIMENTS

1st Embodiment

Hereinafter, a first embodiment of the present invention will be described with reference to FIGS. 1 to 5.

Figure 1:
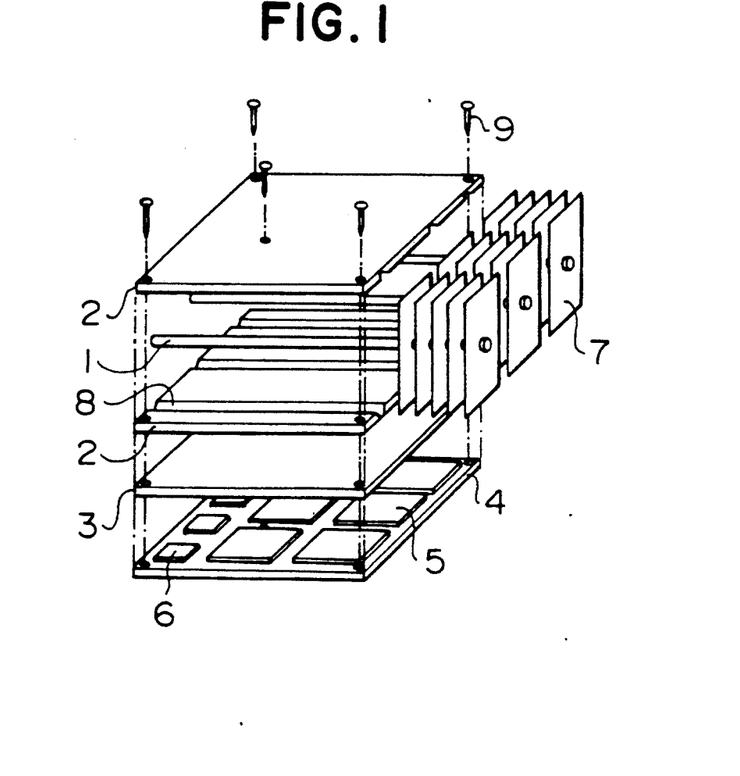
FIG. 1 is an exploded perspective view showing one embodiment of a heat radiating device for a computer according to the present invention.
Figure 2:
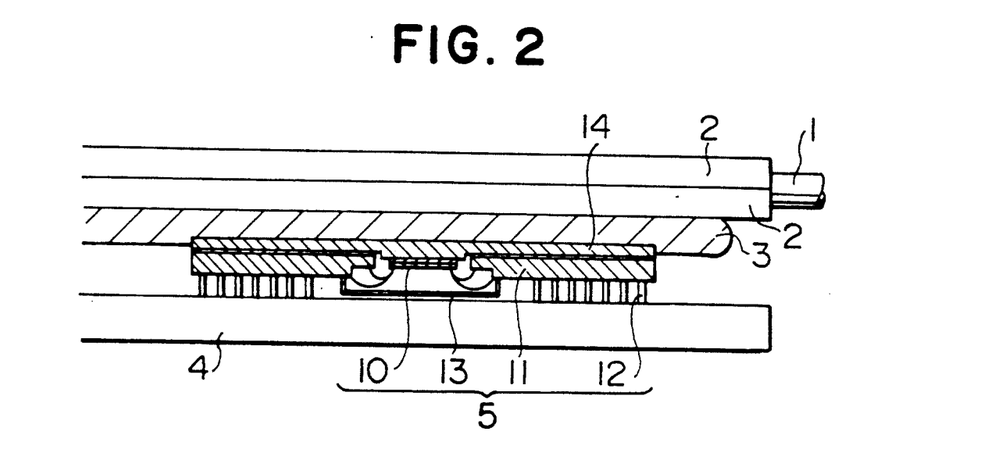
FIG. 2 is an enlarged partly sectional front view of a heat transfer section shown in FIG. 1.
Figure 3A:
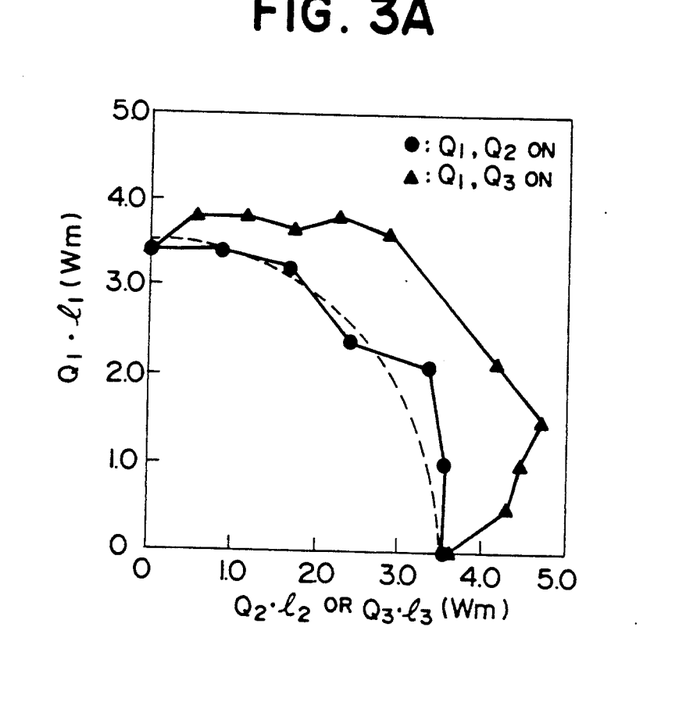
FIGS. 3A and 3B are, respectively, a characteristic graph showing the relationship between maximum amounts of heat transportable through a heat pipe and positions of a heat absorbing portion thereof, and a schematic view showing a method of experiments for measuring the characteristics of FIG. 3A.
Figure 3B:
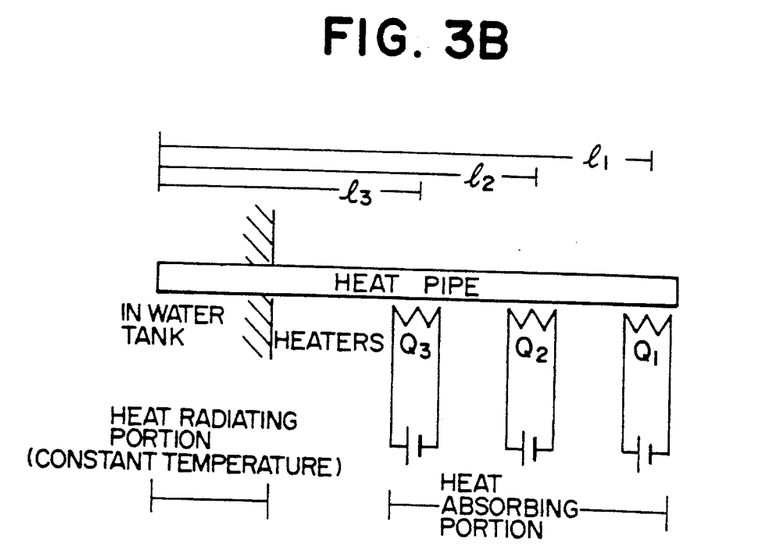
Figure 4:
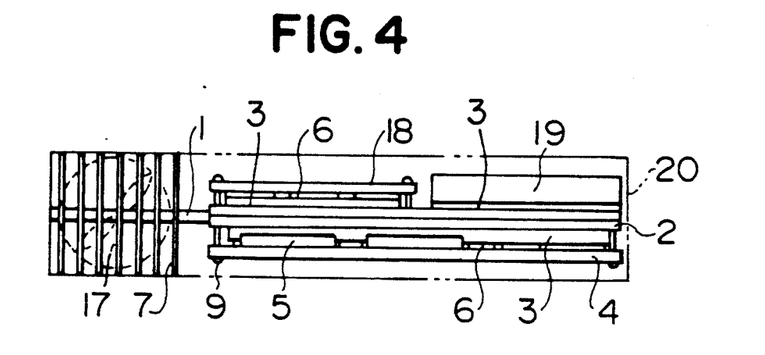
FIG. 4 is a front view showing a heat radiating device for a computer according to the present invention, the device accommodated in a computer housing.
Figure 5:
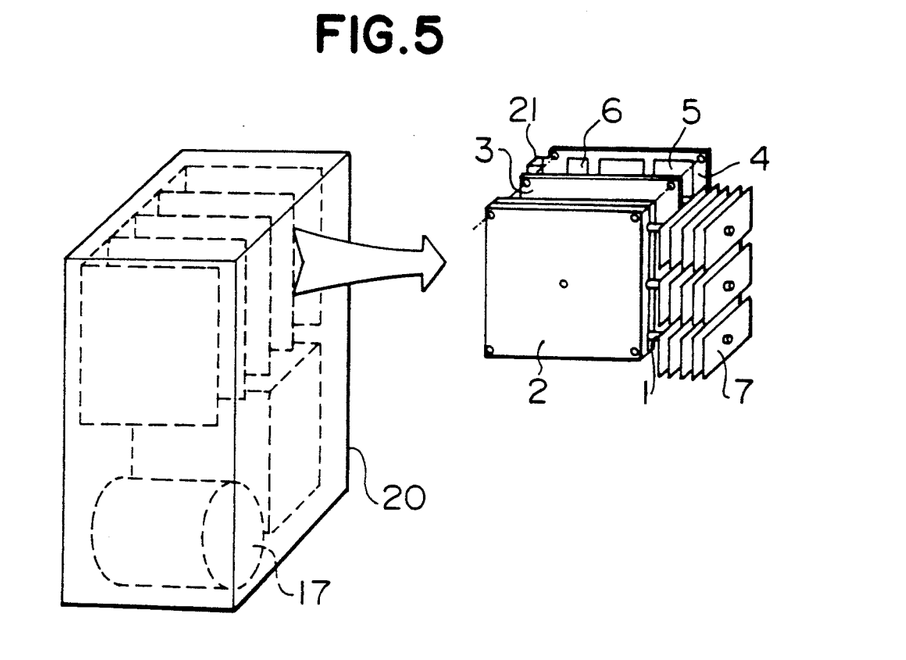
FIG. 5 is a perspective view showing a heat radiating device accommodated in another computer housing.

FIG. 1 is an exploded perspective view showing the first embodiment of a heat radiating device for a computer according to the present invention, FIG. 2 is an enlarged partly sectional front view of a heat transfer section shown in FIG. 1, FIG. 3A is a characteristic graph showing the relationship between set positions of heat generating electronic parts and heat generated from the heat generating electronic parts immediately before the occurrence of a dryout phenomenon resulting from experiments with a heat pipe to which heat is input at two portions, FIG. 3B is a schematic view for explaining a method of the experiments, FIG. 4 is a front view showing the heat radiating device of FIG. 1 accommodated in a computer housing, and FIG. 5 is a perspective view showing the heat radiating device of FIG. 1 accommodated in another computer housing.

In FIG. 1, a heat radiating device for a computer comprises a single or a plurality of heat pipes 1 each having a plurality of heat radiation fins 7, a pair of flat heat transfer boards 2 made of a good heat conductive material and engaged with the heat pipes 1, a plurality of heat generating electronic parts such as LSI chip packages 5 generating much heat and LSI chip packages 6 generating less heat, a printed circuit board 4 carrying these heat generating electronic parts thereon, and a heat transfer sheet 3 made of a good heat conductive material and transferring heat generated from the heat generating electronic parts to the heat transfer boards 2. The heat transfer boards 2 and the heat transfer sheet 3 jointly constitute a heat transfer member.

The heat radiation fins 7 are fixed to one end of each heat pipe 1 perpendicularly to the pipe axis. The remaining portion of the heat pipe 1, including the opposite end thereof, is placed in a pair of coupling grooves 8 in the confronting surfaces of the two heat transfer boards 2. The printed circuit board 4 carrying the heat generating electronic parts mounted thereon, from which the generated heat must be removed, is disposed on one side of one of the heat transfer boards 2 in parallel thereto. The heat transfer boards 2 and the printed circuit board 4 are fastened together by screws 9 with the heat transfer sheet 3 interposed between the heat generating electronic parts and the one heat transfer board 2, the heat transfer sheet 3 being made of a material, such as silicone rubber, which has both thermal conductivity and flexibility. In addition, for the purpose of preventing the occurrence of a dryout phenomenon, the heat generating electronic parts are arranged on the printed circuit board 4 such that the LSI chip packages 5 generating much heat are located in respective heat absorbing portions of the heat pipes 1 at positions nearer to the heat radiation fins 7 and the LSI chip packages 6 generating less heat are located therein at positions farther from the heat radiation fins 7.

The components of the first embodiment will then be explained one by one.

The heat pipes 1 are each made of material such as a copper alloy, aluminum alloy or stainless steel. A medium such as water, alcohol or ammonia is sealingly enclosed in each heat pipe 1 under a depressurized condition. The heat pipe 1 is provided in its heat radiating portion with the heat radiation fins 7 each formed of a copper plate, an aluminum plate or the like.

The pair of heat transfer boards 2 comprise two flat plates each made of a good conductor of heat, such as an aluminum alloy, and are formed in their confronting surfaces with a plurality of coupling grooves 8 each of which is semicircular in cross-section and has a radius slightly larger than the radius of the associated heat pipe 1. These coupling grooves 8 are disposed to face each other and are machined so as to define a cylindrical through-hole when the two heat transfer boards 2 are superposed one on the other. By fastening the screws 9, the heat pipes 1 are fixed in the respective pairs of coupling grooves 8 such that the heat pipes 1 are sandwiched between the two heat transfer boards 2.

The heat transfer sheet 3 serves as a cushioning material to prevent the electronic parts from being broken due to the load applied when the screws are fastened. For this reason, material of low rigidity is suitable as the heat transfer sheet 3. Not to impede the efficiency of heat transfer, however, the sheet material must have a high degree of thermal conductivity at the same time. A practical example of the sheet material satisfying such demands is silicone rubber, or silicone rubber combined with metallic or ceramic material, etc. which has a high degree of thermal conductivity. Also, it is effective to shape the heat transfer sheet 3 complementarily to the outer configurations of the electronic parts for improving heat transfer in the contact regions between the heat generating electronic parts and the heat transfer sheet 3.

FIG. 2 shows details of a heat transfer section near one of the LSI chip packages 5 generating much heat which generates maximum heat. Though the LSI chip packages are not particularly limited in shape, a pin grid array package having a thermal spreader 14 as shown in FIG. 2 is preferable to effectively utilize the package upper surface as a heat transfer surface. In the illustrated package structure, there are formed a through-hole which is located near the center of a printed circuit board 11 built in the package and has a size large enough to receive an LSI chip 10 therein, a plurality of substrate pads disposed on the underside of the package and in the peripheral areas of the through-hole for connection to the LSI chip 10, and a plurality of I/O pins 12.

The substrate pads and the I/O pins 12 are electrically connected to each other via the surface or an inner layer of the printed circuit board 11 built in the package. The thermal spreader 14 made of a good conductor of heat such as metallic or ceramic material is integrally fixed by an adhesive to the upper surface of the printed circuit board 11 built in the package. The LSI chip 10 is directly connected to the surface of a window defined by the thermal spreader 14 and the through hole in the printed circuit board 11 built in the package. The substrate pads on the underside of peripheral areas of the through-hole and the LSI chip 10 are electrically connected to each other by bonding wires for connection to the I/O pins 12.

The LSI chip package 5 is fixed in place and electrically connected to the printed circuit board 4 by the I/O pins 12. The printed circuit board 4 carrying a plurality of electronic parts mounted thereon, including the illustrated LSI chip package 5, and the heat transfer boards 2 are fastened together by tightening screws in such a manner that the electronic parts are sandwiched therebetween.

The manner of arranging the heat generating electronic parts on the printed circuit board will then be described. Although each of the heat pipes used in the heat radiating device shown in FIG. 1 is of a superior heat transfer element, there occurs a phenomenon of dryout which impairs the heat transfer action of the heat pipe, if heat is input in an amount over a certain value.

In a heat radiating device using heat pipes, therefore, it is required to estimate the amount of input heat at which there occurs a phenomenon of dryout in the heat pipe, i.e., the maximum amount of heat transportable through the heat pipe. Moreover, it has been confirmed from experiments that, when heat is input to a single heat pipe from a number of heat generating electronic parts as shown in FIG. 1, the maximum amount of heat transportable through the heat pipe largely depends on not only the heat generated from the individual parts, but also the set positions of the individual parts. Results of the experiments are shown in FIG. 3.

First, the principles of operation of a heat pipe will be described.

Figure 10A:
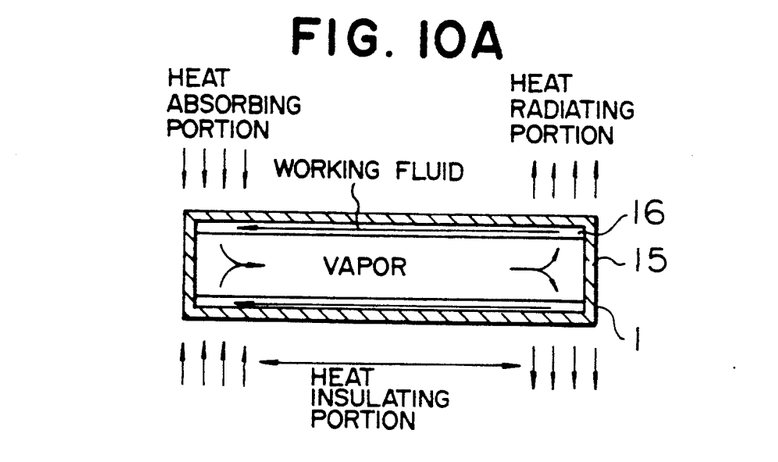
FIGS. 10A and 10B are views for explaining the principle of operation of the heat pipe.
Figure 10B:
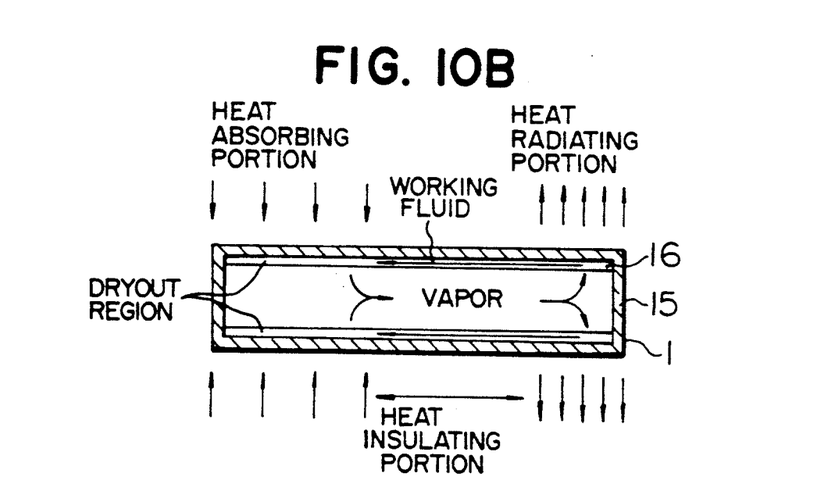

FIGS. 10A and 10B illustrate the principles of operation of a heat pipe. FIG. 10A illustrates a heat pipe in a state used in a usual manner. The heat pipe 1 comprises a container 15 provided in its inner wall with fine grooves or the like called wicks 16, and a medium called a working fluid which is sealingly enclosed in the container 15. The heat pipe 1 is generally tubular in shape. Heat generated from electronic parts or the like is transferred to a heat absorbing portion of the heat pipe 1 where the working fluid in the wicks 16 is evaporated to produce vapor. The heat is rapidly transported in the form of latent heat together with the vapor to a heat radiating portion at low temperatures where the vapor is condensed into a liquid while radiating heat to the exterior. The condensed liquid permeates into the wicks 16 and is then led back to the heat absorbing portion with a capillary phenomenon. Subsequently, the above cycle is repeated to efficiently transport the heat from the heat absorbing portion to the heat radiating portion. However, if the heat input to the heat pipe 1 is too much, the working fluid sealingly enclosed in the heat pipe is all evaporated and the above heat transfer cycle is destroyed, resulting in the phenomenon of dryout in which the heat pipe fails to fulfill its function any longer.

Furthermore, the phenomenon of dryout also occurs if the heat absorbing portion in which heat is input to the heat pipe is relatively long in comparison with the entire length of the heat pipe. This condition is shown in FIG. 10B. In this case, although the working fluid condensed in the heat radiating portion circulates through the wicks 16, the long heat absorbing portion causes the condensed working fluid to begin its evaporation before reaching the outermost end of the heat absorbing portion and to gradually reduce the amount of the circulating working fluid. Therefore, the phenomenon of dryout is more likely to occur and the efficiency of heat transfer is lowered as the outermost end of the heat absorbing portion is approached.

FIG. 3A shows results of the experiments in which one end of a heat pipe was held at a constant temperature and heaters were provided at three points along the remaining portion of the heat pipe, as shown in FIG. 3B, two of the three heaters being turned on for heating: namely, it shows the relationship between products $Q_i \cdot l_i$ of heat (thermal values) $Q_1$, $Q_2$ and $Q_3$ generated from the heaters at the time phenomenon of dryout occurs in the heat pipe and set positions of the heaters, i.e., the distances $l_1$, $l_2$ and $l_3$ from the outermost end of the heat radiating portion to the mount positions of the heaters. It will be seen from FIG. 3A that the heat pipe causes a phenomenon of dryout when $Q_i \cdot l_i$ meets the following equation (2):

$$(Q_1 \cdot l_1)^2 + (Q_2 \cdot l_2)^2 > (Q \cdot l)^2$$

$$\text{or } (Q_1 \cdot l_1)^2 + (Q_3 \cdot l_3)^2 > (Q \cdot l)^2 \qquad (2)$$

Where heat is input to the heat absorbing portion of the heat pipe from a number n of heat generating electronic parts, the heat pipe can be safely used without causing a phenomenon of dryout by determining the heat (thermal value) $Q_i$ and the set position $l_i$ of each of the heat generating electronic parts so as to meet the following equation (3);

$$\sum_{i=1}^{n} (Q_i \cdot l_i)^2 < (Q \cdot l)^2 \qquad (3)$$

where Q is heat applied to the heat pipe causing a phenomenon of dryout when the heat pipe having one end held at a constant temperature is heated at the other end, and l is a length of the heat pipe.

FIG. 4 shows a state where the heat radiating device shown in FIG. 1 is disposed in a computer housing 20. In FIG. 4, the heat radiating device is arranged as one piece in the computer housing such that the axial direction of the heat pipe 1 coincides with the direction of the length of the computer housing. The printed circuit board 4 carrying the heat generating electronic parts mounted thereon is screwed to the heat transfer boards 2 via a heat transfer sheet 3. Additionally, in this embodiment, a power supply circuit board 18 carrying LSI chip packages 6 generating less heat and a magnetic storage system 19 are also screwed, via other heat transfer sheets 3, to the heat transfer boards 2 on the side thereof spaced from the printed circuit board so that heat generated from both the circuit board 18 and the storage system 19 is also transferred to the heat pipe 1 through the heat transfer boards 2. Further, because the computer housing 20 is divided into a space 17 for accommodating the heat radiation fins 7 and a space for accommodating the electronic parts, the removal of heat from the computer housing is performed only in the space for the heat radiation fins.

FIG. 5 shows an example in which the heat radiating device shown in FIG. 1 is accommodated in another computer housing. The computer housing of this example is assumed to be for use in a desk-side type work station and, therefore, has dimensions larger than that of the above example. A plurality of printed circuit boards 4 each carrying heat generating electronic parts mounted thereon are accommodated in the computer housing of this example. Heat transfer boards 2 coupled to the heat pipes 1, which have heat radiation fins 7 attached to their one ends, are fastened to each of the printed circuit boards 4 via a heat transfer sheet 3. Since a heat removing area is limited to the space for the heat radiation fins, it is required to supply heat-removing air to only that space, enabling a reduction in flow rate of the heat-removing air. As a result, a reduction in both size of the computer housing and noise of the computer can be realized.

According to the heat radiating structure for a computer described as the first embodiment, heat generated from heat generating electronic parts can be transferred to the heat transfer sheet, the heat transfer boards and then to heat pipes which perform heat exchange with the outside air collectively at the heat radiation fins for removing the heat externally of the computer, without causing a phenomenon of dryout in the heat pipes. Further, since the outside air is required to be introduced to a limited part of the computer housing and there is no need for installing heat sinks or the like directly on the heat generating electronic parts, the entire computer size can be reduced.

2nd Embodiment

Figure 6:
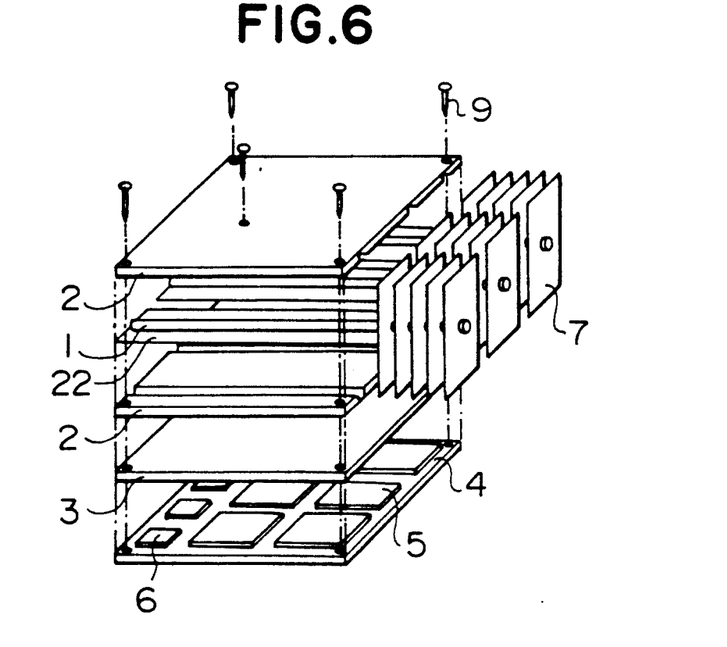
FIG. 6 is an exploded perspective view showing another heat radiating structure for a computer according to the present invention.

A second embodiment of the present invention will now be described. FIG. 6 is an exploded perspective view of a heat radiating structure for a computer according to the second embodiment. In this embodiment, as in the first embodiment, the heat transfer boards 2 coupled to the heat pipes 1 are fastened via a heat transfer sheet 3 to a printed circuit board 4 carrying a plurality of heat generating electronic parts thereon. The heat generating electronic parts are arranged on the printed circuit board 4 in such a manner that the electronic parts generating much heat are located in respective heat absorbing portions of the heat pipes 1 at positions nearer to their heat radiating portions and the electronic parts generating less heat are located therein at positions farther from the heat radiating portions. Additionally, in this embodiment, the heat pipes 1 coupled to the heat transfer boards 2 are each provided in their heat absorbing portions with heat absorption fins 22 extending parallel to the heat pipe 1. This arrangement accelerates heat transfer from the heat transfer boards 2 to the heat pipes 1.

3rd Embodiment

Figure 7A:
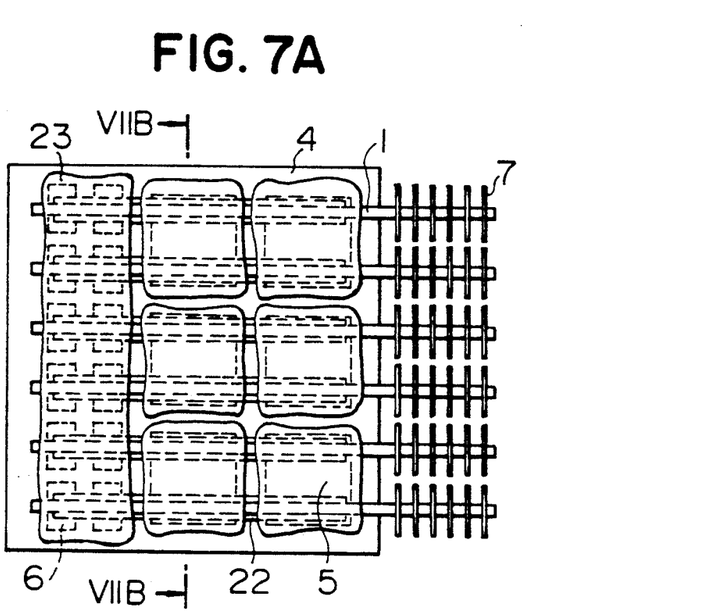
FIGS. 7A and 7B are, respectively, a front view and a side sectional view showing still another heat radiating device for a computer according to the present invention.
Figure 7B:
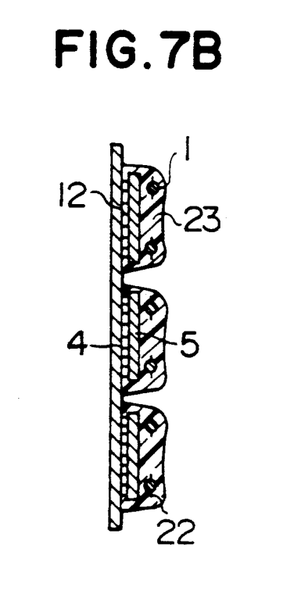

A third embodiment of the present invention will now be described. FIGS. 7A and 7B are, respectively, a front view and a side sectional view showing a heat radiating device for a computer according to the third embodiment. In this embodiment, in the first embodiment, as the heat generating electronic parts are arranged on the printed circuit board 4 in such a manner that the electronic parts generating much heat are located in respective heat absorbing portions of the heat pipes 1 at positions nearer to their heat radiating portions and the electronic parts generating less heat are located therein at positions farther from the heat radiating portions. Additionally, the heat absorbing portions of the heat pipes 1 are each bonded to the regions including the heat generating electronic parts by a medium 23 having a high thermal conductivity, such as silicone rubber.

With this embodiment, the heat radiating device can be more easily constructed than the preceding embodiments which employ heat transfer boards and the heat transfer sheet. If the structure is designed to be tight enough to prevent leakage, the medium 23 having a high thermal conductivity may be a fluid medium such as grease. Furthermore, the heat pipes 1 may be provided in their heat absorbing portions with heat absorption fins 22 to accelerate heat transfer.

4th Embodiment

Figure 8A:
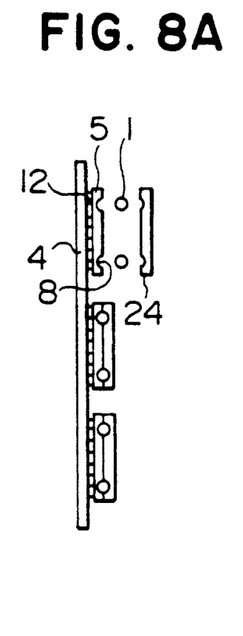
FIGS. 8A and 8B are, respectively, a front view and a side view showing still another heat radiating device for a computer according to the present invention.
Figure 8B:
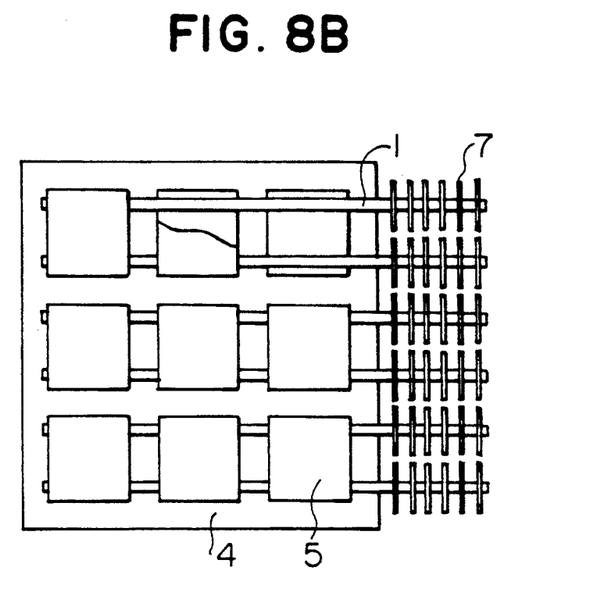

A fourth embodiment of the present invention will next be described. FIGS. 8A and 8B are a front view and a side sectional view showing a heat radiating device for a computer according to the fourth embodiment. In this embodiment, as in the first embodiment, the heat transfer boards 2 (not shown) coupled to the heat pipes 1 are fastened via the heat transfer sheet 3 (not shown) to the printed circuit board 4 carrying a plurality of heat generating electronic parts thereon. The heat generating electronic parts are arranged on the printed circuit board 4 in such a manner that the electronic parts generating much heat are located in respective heat absorbing portions of the heat pipes 1 at positions nearer to their heat radiating portions and the electronic parts generating less heat are located therein at positions farther from the heat radiating portions. The heat pipes 1 are each held between a groove 8 provided in the upper surface of the LSI chip package 5 generating much heat and another groove provided in a cover 24 disposed in abutment with the LSI chip package 5 generating much heat. This embodiment is suitable for the case in which chip packages of the same configuration are employed and is effective to efficiently transfer heat from the heat generating electronic parts to the heat pipes 1 because the heat pipes 1 can be disposed very close to the heat generating electronic parts. Additionally, the heat pipes 1 may be provided in their heat absorbing portions with heat absorption fins 22 (not shown) to further accelerate heat transfer.

5th Embodiment

Figure 9A:
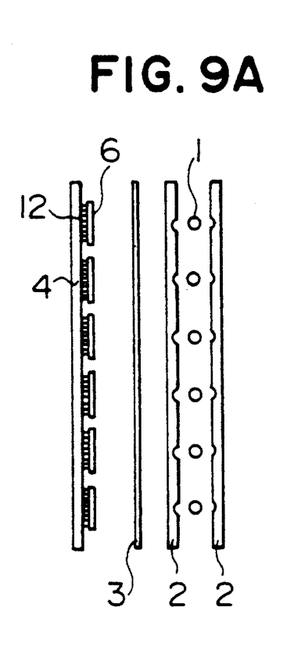
FIGS. 9A and 9B are, respectively, a front view and a side view showing still another heat radiating device for a computer according to the present invention.
Figure 9B:
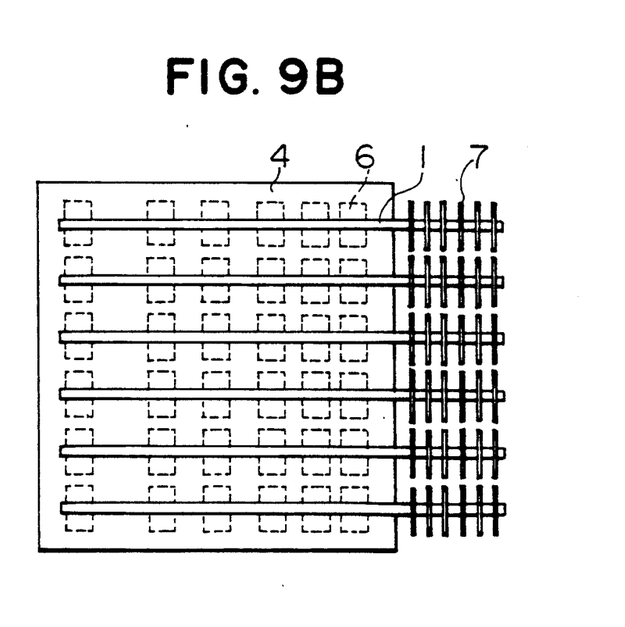

A fifth embodiment of the present invention will next be described. FIGS. 9A and 9B are a front view and a side sectional view showing a heat radiating device for a computer according to the fifth embodiment. In this embodiment, as in the first embodiment, the heat transfer boards 2 coupled to the heat pipes 1 are fastened via the heat transfer sheet 3 to the printed circuit board 4 carrying a plurality of heat generating electronic parts thereon. The LSI chip packages 6 are arranged on the printed circuit board 4 with a higher density in areas nearer to respective heat radiating portions of the heat pipes 1 and with a lower density in areas farther from the heat radiating portions. Accordingly, heat input to the heat pipes 1 is larger in amount in the portions thereof nearer to the heat radiation fins and is smaller in amount in the portions of the heat pipes more remote from the heat radiation fins. As a result, the heat pipes 1 can be prevented from drying out to thereby ensure efficient heat transfer.

As fully described, the present invention makes it possible to prevent the heat pipes from drying out, effectively radiate heat generated from a plurality of electronic parts such as LSI chips and suppress an excessive rise in temperature of the electronic parts.

What is claimed is:

1. An electronic equipment comprising:
   a plurality of electronic parts generating different amounts of heat;
   at least one heat pipe having a first portion adjacent one end of said at least one heat pipe for absorbing the heat generated from said electronic parts and a second portion adjacent the other end of said at least one heat pipe for radiating the thus absorbed heat; and
   at least one generally flat heat transfer means disposed to cover said first portion of said at least one heat pipe;
   said electronic parts being arranged in heat conducting relation with said heat transfer means such that an electronic part generating a greater amount of heat is disposed on said heat transfer means at a first point relatively closer to said second portion of said at least one heat pipe than a second point and another electronic part generating a smaller amount of heat is disposed on said heat transfer means at said second point relative further from said second portion than said first point and between said first point and said one end of said at least one heat pipe, wherein the heat generated by each of said electronic parts and the distance from the other end of said at least one heat pipe to the electronic part has a relationship given by the following equation:

$$\sum_{i=1}^{n} (Q_i \cdot l_i)^2 < (Q \cdot l)^2$$

where $Q_i$ is the amount of head generated from each of said electronic parts, $l_1$ is a distance from the other end of said heat pipe to each of said electronic parts, Q is the amount of heat generated from any one of said electronic parts when a phenomenon of dryout of a heat transfer liquid in said heat pipe takes place, l is a distance from said other end of said heat pipe to the electronic part when the dryout takes place, and $i = 1 \ldots n$ indicates the number of said electronic parts.

2. An electronic equipment comprising:
a plurality of electronic parts generating different amounts of heat;
at least one heat pipe having a first portion adjacent one end of said at least one heat pipe for absorbing the heat generated from said electronic parts and a second portion adjacent the other end of said at least one heat pipe for radiating the thus absorbed heat; and
at least one generally flat heat transfer means disposed to cover said first portion of said at least one heat pipe;
said electronic parts being arranged in heat conducting radiation with said heat transfer means such that an electronic part generating a greater amount of heat is disposed on said heat transfer means at a first point relatively closer to said second portion of said at least one heat pipe than a second point and another electronic part generating a smaller amount of heat is disposed on said heat transfer means at said second point relatively further from said second portion than said first point and between said first point and said one end of said at least one heat pipe, wherein said heat transfer means comprises a flexible heat transfer sheet and a heat receiving plate member covering said heat pipe.

3. An electronic equipment comprising:
a plurality of electronic parts generating heat;
at least one heat pipe having a first portion adjacent one end of said at least one heat pipe for absorbing the heat generated from said electronic parts and a second portion adjacent the other end of said at least one heat pipe for radiating the thus absorbed heat; and
at least one generally flat heat transfer means disposed to cover said first portion of said at least one heat pipe;
said electronic parts being arranged on said heat transfer means such that the distance between each adjacent pair of said electronic parts is smaller at a first point of said heat transfer means relatively closer to said second portion of said at least one heat pipe than at a second point of said heat transfer means relatively further from said second portion than said first point and adjacent said one end of said at least one heat pipe, wherein the heat generated by each of said electronic parts and the distance from the other end of said at least one heat pipe to the electronic part has a relationship given by the following equation:

$$\sum_{i=1}^{n} (Q_i \cdot l_i)^2 < (Q \cdot l)^2$$

where, $Q_i$ is the amount of heat generated from each of said electronic parts, $l_i$ is a distance from the other end of said heat pipe to each of said electronic parts, Q is the amount of heat generated from any one of said electronic parts when a phenomenon of dryout of a heat transfer liquid in said heat pipe takes place, l is a distance from said other end of said heat pipe to the electronic part when the dryout takes place, and $i = 1 \ldots n$ indicates the number of said electronic parts.

* * * * *